United States Patent [19]

Cusdin et al.

[11] Patent Number: 5,846,691
[45] Date of Patent: Dec. 8, 1998

[54] COMPOSITE RELIEF IMAGE PRINTING PLATES AND METHODS FOR PREPARING SAME

[75] Inventors: George Cusdin, Smyrna; Joseph Crowell, Powder Springs, both of Ga.

[73] Assignee: Polyfibron Technologies, Inc., Atlanta, Ga.

[21] Appl. No.: 676,591

[22] Filed: Jul. 8, 1996

[51] Int. Cl.⁶ ............................. G03F 7/095; G03F 9/00
[52] U.S. Cl. ..................... 430/300; 430/306; 430/273.1
[58] Field of Search .................... 430/22, 273.1, 430/300, 306

[56] References Cited

U.S. PATENT DOCUMENTS

| | | | |
|---|---|---|---|
| 1,736,914 | 11/1929 | Huebner | 430/300 |
| 2,111,914 | 3/1938 | Kohlberger | 430/22 |
| 3,265,765 | 8/1966 | Holden et al. | 260/876 |
| 3,867,153 | 2/1975 | MacLachlan | 96/79 |
| 4,264,705 | 4/1981 | Allen | 430/271.1 |
| 4,265,986 | 5/1981 | Allen et al. | 430/18 |
| 4,320,188 | 3/1982 | Heinz et al. | 430/281.1 |
| 4,323,636 | 4/1982 | Chen | 430/271.1 |
| 4,323,637 | 4/1982 | Chen et al. | 430/271.1 |
| 4,369,246 | 1/1983 | Chen et al. | 430/306 |
| 4,423,135 | 12/1983 | Chen et al. | 430/271.1 |
| 4,427,759 | 1/1984 | Gruetzmacher et al. | 430/273.1 |
| 4,460,675 | 7/1984 | Gruetzmacher et al. | 430/300 |
| 4,622,088 | 11/1986 | Min | 156/244.11 |
| 5,135,827 | 8/1992 | Bohm et al. | 430/30 |
| 5,223,375 | 6/1993 | Berrier et al. | 430/281.1 |

FOREIGN PATENT DOCUMENTS

| | | |
|---|---|---|
| 0456336 A2 | 11/1991 | European Pat. Off. . |
| 0465949A2 | 1/1992 | European Pat. Off. . |
| 0640878 A1 | 3/1995 | European Pat. Off. . |
| 4117127 | 11/1992 | Germany . |
| 58-48055A | 3/1983 | Japan ................... 430/300 |
| 63-109052 | 5/1988 | Japan . |
| 63-109052A | 5/1988 | Japan . |
| 5-230408 A | 9/1993 | Japan . |
| 6-11840A | 1/1994 | Japan ................... 430/300 |
| 6-250372A | 9/1994 | Japan ................... 430/22 |
| 1366769 | 9/1974 | United Kingdom . |
| 2281250 | 3/1995 | United Kingdom ........ 430/300 |

OTHER PUBLICATIONS

CA 118: 157929 from Chemical Abstracts, American Chemical Society, English Abstract of DE4117127 (Bauer) 26 Nov. 1992.
World Patents Index AN 93–399940, Derwent Information Ltd, English Abstract of DE 4117127 (Bauer) 26 Nov. 1992.
World Patents Index AN 92–017597, Derwent Information Ltd., English Abstract of EP 465949 A (Bauer et al).
CA 117: 101041 from Chemical Abstracts, American Chemical Society, English Abstract of EP 465949 (Bauer et al).

(List continued on next page.)

*Primary Examiner*—Cynthia Hamilton
*Attorney, Agent, or Firm*—Woodcock Washburn Kurtz Mackiewicz & Norris LLP

[57] ABSTRACT

High-quality composite printing elements are prepared without the need for precise registration of constituent photocurable elements by disposing at least one photocurable element, and preferably a plurality of photocurable elements, upon a surface of a substantially planar carrier sheet in approximate register and then transferring a computer-generated negative onto a surface of the elements.

20 Claims, 3 Drawing Sheets

OTHER PUBLICATIONS

63–109052, Patent Abstracts of Japan, vol. 12, No. 347, 19 Sep. 1988, English Abstract of JP–109052 (Horiike et a.).

World Patent Index AN 96–445569, Derwent Information Ltd., English Abstract of JP 63–109052 (Cannon KK) 13 May 1988.

109: 160645, from Chemical Abstracts, American Chemical Society, English Abstract of JP 63–109052 (Horiike et al).

PCT International Search Report dated Jun. 26, 1997, 3 pages.

World Patents Index AN92–399940 Derwent Information, Ltd., English abstract of DE 4117127 (Bauer), Nov. 26, 1992.

World Patents Index AN93–317716 Derwent Information, Ltd., English abstract of JP 05230408 A (Seiko Epson Corp.), Sep. 7, 1993.

119:273625 from Chemical Abstracts Online, American Chemical Society, English Abstract of JP 05–230408 A2 (Yanase et al.), Sep. 7, 1993, See IT 131–55–5, Uvinul D 50.

RN 131–55–5 of Registry Online, American Chemical Society, 1997.

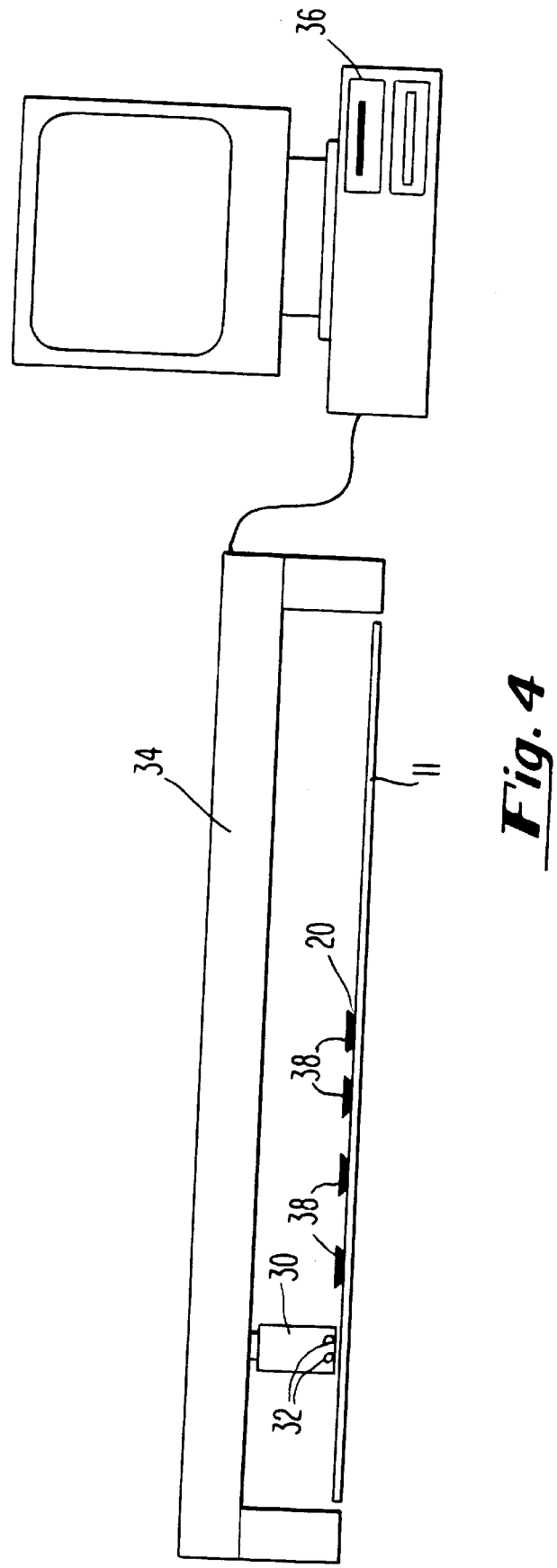

COMPOSITE RELIEF IMAGE PRINTING PLATES AND METHODS FOR PREPARING SAME

FIELD OF THE INVENTION

The present invention is directed to the preparation of composite printing plates and, more particularly, to the direct transfer of digital images to such composites without the use of phototools or photomasks.

BACKGROUND OF THE INVENTION

Relief image printing plates are used in both flexographic and letterpress processes for printing on a variety of substrates, including paper, corrugated stock, film, foil, and laminates. The photocurable elements that are used to make relief plates typically include a support layer and one or more layers of photocurable polymer in the form of solid sheets. The printer typically peels a cover sheet from the element to expose the photocurable polymer and places a silver halide photographic negative or some other masking device upon the photopolymer. The negative-bearing photocurable element then is exposed to ultraviolet (UV) light through the negative, thereby causing exposed areas of the element to harden, or cure. After the uncured areas of the element are removed, cured polymer remains as the relief printing surface.

Corrugated boxes and other, relatively large objects that are printed using relief image printing plates often bear actual printing on only a small portion of their total surface area. One way to print such an object is to prepare a single relief image plate having a surface area corresponding to the total surface area of the object. Since only a portion of the object's surface needs to be printed, however, only a portion of the relief image plate will actually used for ink transfer. The remainder of the plate will be unused and, essentially, wasted.

To minimize such waste, those skilled in the art often print relatively large objects with composite printing plates that are prepared by mounting a plurality of relief image printing plates on a common carrier sheet. The individual plates, however, are mounted only on those portions of the carrier that correspond to the portions of the object that actually need to be printed. Although such composite plates do minimize waste, the current system for mounting their constituent relief image plates is laborious and requires careful adhesion of the plates to the carrier while assuring registration to within 0.005 inches on-press for high quality printing and multi-color reproduction. For multi-color reproduction, wherein a single plate is used for printing each of the individual colors, accurate registration of the plates with respect to one another is crucial.

Consequently, there remains a need in the art for alternative processes for preparing composite printing plates. In particular, there remains a need for alternative processes for accurate registration of the constituent relief image printing plates or for processes wherein accurate registration is not necessary.

OBJECTS OF THE INVENTION

It is one object of the present invention to provide methods for preparing composite printing plates.

It is another object of the invention to provide methods for registration of at least one relief image printing plate on a common carrier sheet.

It is a further object to provide methods for printing registration information directly onto the surface of the carrier sheet using a computer.

It is yet another object to provide methods for transferring an electronically stored negative image directly onto a composite printing plate.

BRIEF DESCRIPTION OF THE INVENTION

These and other objects are satisfied by the present invention, which provides methods for preparing high-quality composite printing plates without the need for individual registration of constituent relief image plates. These methods comprise the steps of disposing a photocurable element upon a surface of a substantially planar carrier sheet in approximate register and then transferring a computer-generated negative onto element. In preferred embodiments, the methods of the invention comprise the steps of providing at least two substantially planar photocurable elements that have first and second opposing major faces of defined surface area, disposing a first face of the photocurable elements upon a first face of a substantially planar carrier sheet having first and second opposing major faces of defined surface area, and ejecting the negative-forming ink from an ink jet print head onto second faces of said photocurable elements.

Approximate registration of the photocurable elements can be achieved by transferring computer-generated registration information to a surface of the carrier sheet through ejection of ink from an ink jet print head onto the sheet. The registration information can, for example, comprise a series of images whose respective shapes correspond to the outlines of the individual photocurable plates. Following the transfer of registration information, photocurable elements are placed on the carrier sheet in accordance with the positions dictated by the registration information.

Transfer of the computer-generated negative to composite plates of the invention preferably is achieved by ejecting a negative-forming ink from an ink jet print head. The ink preferably is substantially opaque to actinic radiation in at least one wavelength region effective to cure photocurable material within the element and substantially resistant to polymerization upon exposure to actinic radiation in the wavelength region. Following the negative transfer step, the ink-bearing plate can be exposed to actinic radiation in the wavelength region for a time and under conditions effective to cure exposed areas of the photocurable material, and unexposed (i.e., uncured) areas then are removed to provide the relief printing surface.

The present invention further provides negative-bearing composite printing plates produced in accordance with the foregoing methods. In certain embodiments, the plates comprise a plurality of photocurable elements disposed on a substantially planar carrier sheet, at least two of the photocurable elements including a support layer, photocurable material disposed upon the support layer, and negative-forming ink disposed upon at least a portion of the surface of the photocurable material.

BRIEF DESCRIPTION OF THE DRAWINGS

The numerous objects and advantages of the present invention may be better understood by those skilled in the art by reference to the accompanying non-scale figures, in which:

FIG. 4 is a plan view of a printing apparatus for composite printing plates.

DETAILED DESCRIPTION OF THE INVENTION

The present invention provides methods that eliminate the tedious requirement of having to hand-register individual relief printing plates in preparing high-quality composite printing plates. Although the methods of the invention can be used to prepare printing plates of any size, they are particularly useful in preparing relatively large printing plates (i.e., those having length and/or width greater than about 30 inches). In the methods of the invention, photocurable elements of the appropriate sizes required (or of sizes slightly greater than the sizes required) are mounted on a carrier sheet in approximate register with the areas ultimately to be printed. Precise "registration" of the elements then is achieved by application of a computer-generated negative image to the composite plate via an ink jet printer.

Figure 1:
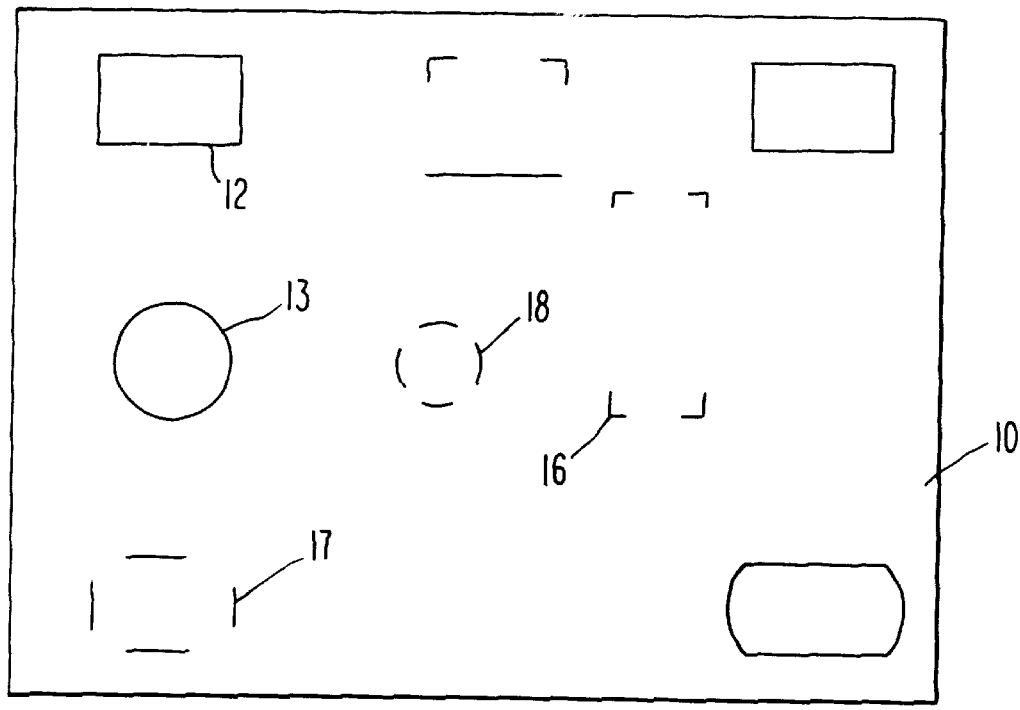
FIG. 1 is a top view of a carrier sheet bearing registration information.

Composite printing plates according to the invention preferably are prepared by first printing computer-generated registration information onto one side of a suitable carrier sheet. The carrier sheet should be substantially planar (i.e., its length and width should be substantially greater, preferably at least ten times greater, than its thickness and it should have two, substantially flat opposing major faces) and can be formed from a transparent or opaque material such as paper, cellulose film, plastic, or metal. In preferred embodiments, the carrier sheet is a polyethylene terephthalate film having a thickness on the order of about 0.004–0.050 inches. As shown in FIG. 1, the registration information printed onto carrier sheet 10 can include complete outlines (e.g., 12, 13) of the photocurable elements to be mounted, incomplete outlines corresponding, for example, to the corners, sides, or arcs of the photocurable elements (see, 16, 17, and 18 respectively), or any other suitable marking that is used to direct placement of the element during the mounting process.

Figure 2:
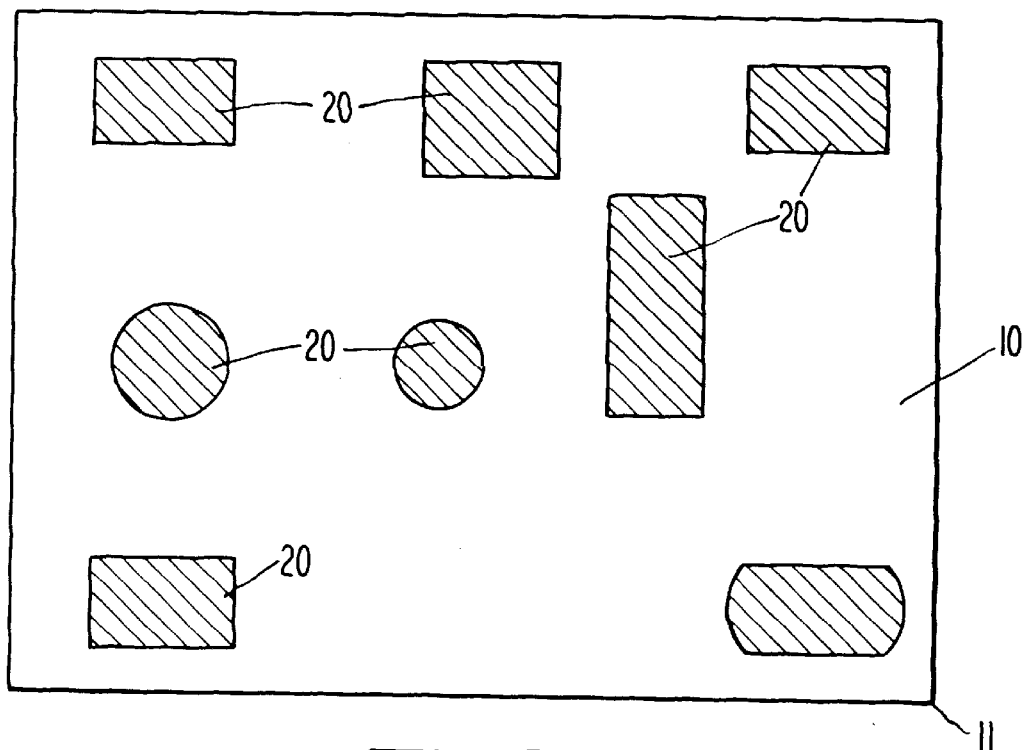
FIG. 2 is a top view of a composite printing plate according to the invention.

As shown in FIG. 2, a composite printing plate 11 according to the invention can be formed by mounting photocurable elements 20 on one face of carrier sheet 10 in accordance with the registration information, that is, in the positions indicated by the printed outlines and/or markings. The photocurable elements can be mounted using any of the many means known to those skilled in the art. Preferred mounting means involve applying silicone caulk, double-sided adhesive tape, or some other suitable adhesive to the carrier sheet, to the photocurable element, or to both. The elements need not be mounted with any particular degree of precision. All that is required is that photocurable elements be mounted on those portions of the composite plate that ultimately will bear relief images.

In accordance with the invention, photocurable elements cover less than all of the surface area of the carrier sheet face upon which they are mounted. Stated differently, the mounted photocurable elements preferably have a cumulative surface area that less than 100% percent of the surface area of the carrier sheet face.

Figure 3:
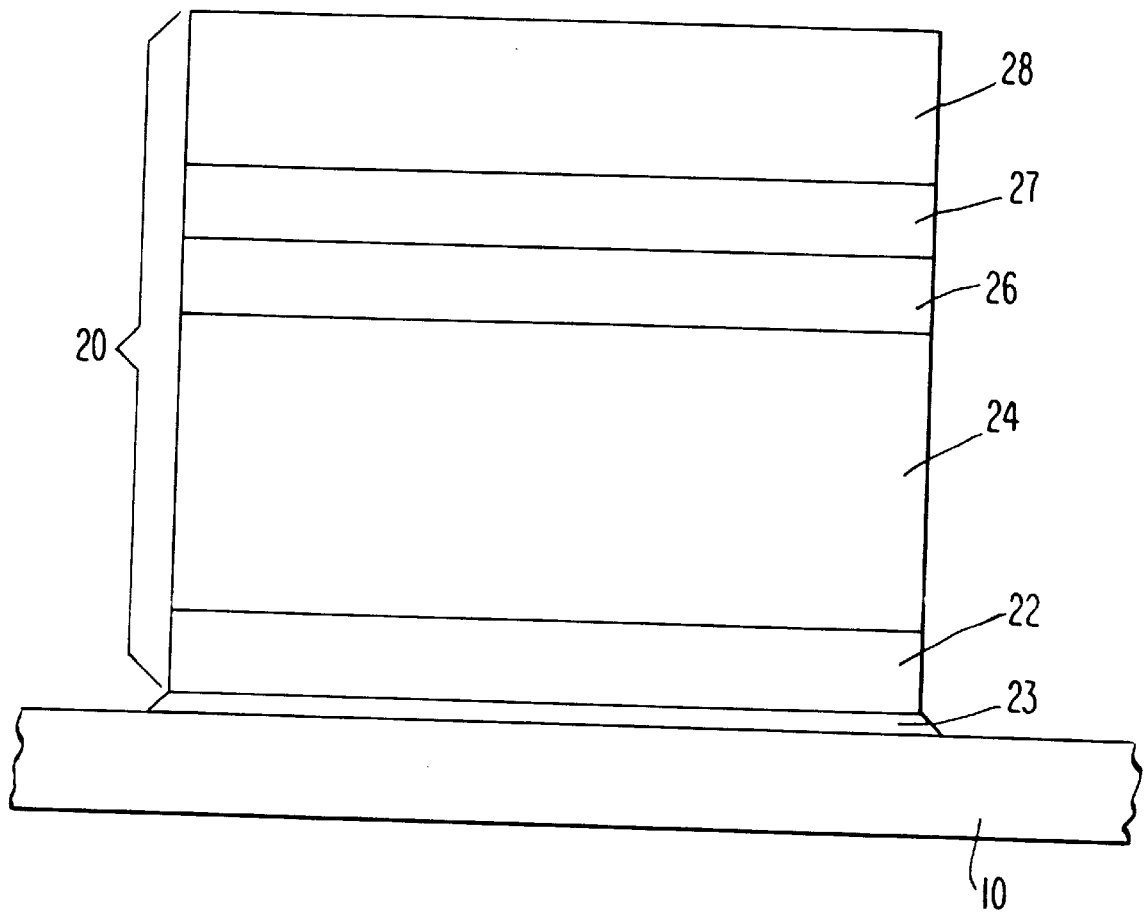
FIG. 3 is a cross-sectional view of a composite printing plate according to the invention.

There are a wide variety of photocurable elements that can be used in accordance with the invention. In preferred embodiments, the elements are solid and vary in thickness from about 0.025 inches to about 0.25 inches and have dimensions up to about 52 inches to about 80 inches. As shown in FIG. 3, a preferred photocurable element 20 comprises a support layer 22, one or more photocurable layers 24, 26 and a removable cover sheet 28. Such photocurable elements optionally comprise a transparent protective layer 27 disposed between the cover sheet and the photocurable layer(s). Also shown in FIG. 3 is adhesive 23 for mounting element 20 on carrier sheet 10.

The support, or backing, layer of the photocurable element can be formed from a transparent or opaque material such as paper, cellulose film, plastic, or metal. In preferred embodiments, it is a polyethylene terephthalate film having a thickness on the order of 0.005 inches. The support optionally bears an adhesive for more secure attachment to the photocurable layer.

The photocurable layer, which generally has a thickness of from about 0.02 to 0.35 inches, can include a variety of known photopolymers, initiators, reactive diluents, fillers, and dyes. Preferred photocurable materials include an elastomer compound, an ethylenically unsaturated compound having at least one terminal ethylenic group, and a photoinitiator. Exemplary photocurable materials are disclosed in European Patent Applications 0 456 336 A2 (Goss, et al.) and 0 640 878 A1 (Goss, et al.), British Patent No 1,366,769, and U.S. Pat. Nos. 5,223,375 (Berrier, et al.), 3,867,153 (MacLahan), 4,264,705 (Allen), 4,265,986 (Allen), 4,323, 636 (Chen, et al.), 4,323,637 (Chen, et al.), 4,369,246 (Chen, et al.), 4,423,135 (Chen, et al.), and 3,265,765 (Holden, et al.), 4,320,188 (Heinz, et al.), 4,427,759 (Gruetzmacher, et al.), 4,460,675 (Gruetzmacher, et al.), 4,622,088 (Min), and 5,135,827 (Bohm, et al.), which are incorporated herein by reference. If a second photocurable layer is used, it typically is disposed upon the first and is similar in composition but considerably thinner, usually less than 0.01 inches.

The photocurable materials of the invention should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even more preferably from about 320 nm to about 380 nm.

The protective layer of the photocurable element, sometimes referred to as the slip film, is disposed upon the photocurable layer(s) and typically is from about 0.001 to about 0.01 inches thick. The protective layer protects the photocurable element from contamination, increases ease of handling, and acts as an ink-accepting layer.

The final layer, the cover sheet, can be formed from plastic or any other removable material that can protect the plate from damage until ready for use.

Representative photocurable elements according to the invention include EPIC® and SPLASH® brand flexographic printing plates (commercially available from Polyfibron Technologies, Inc., Atlanta, Ga.).

Registration preferably is achieved for composite plates by the computer-controlled transfer of a negative image directly to the outwardly-facing surfaces of at least two photocurable elements that have been mounted on the carrier sheet. Such negative images preferably are transferred by depositing a radiation-blocking material on the photocurable elements' respective surfaces. Following exposure to actinic radiation and further processing, those portions of the plate not lying beneath the radiation-blocking material form the relief image.

In preferred embodiments, negative-forming ink is ejected from a printer, such as an ink jet printer, onto the composite plate.

A wide variety of printers can be used in accordance with the present invention. Suitable printers are those that can print (or be adapted to print) well-defined images on various sizes and shapes of composite plates used in the printing industry. The level of definition (resolution)—typically measured in dots per inch (dpi)—should be as great as possible. The amount of ink delivered by the printers of the invention should be sufficient to absorb at least about 85% of any incident actinic radiation, preferably about 90% of such radiation, more preferably about 95%, and even more preferably 99.9% of such radiation. Preferred printers are those that are able to deliver a fully radiation-absorptive amount of ink in a single printing, although with some printers (and with some inks) multiple printings may be necessary to deliver a radiation-absorptive amount.

Ink jet printers are particularly preferred. Ink jet printing is performed by discharging ink droplets from a print head to a substrate. The droplets typically are ejected through orifices or nozzles in the print head and are directed to the substrate to form an image thereon. In contrast to many other types of printing, there usually is no contact between the printer and the substrate with ink jet printing. Virtually any ink jet printer can be used in accordance with the present invention, so long as it has both a print head and some means for controlling and/or directing the ejection of ink therefrom. Similarly, virtually any print head known in the art can be employed, so long as it comprises at least one nozzle which ejects ink droplets in response to control signals. Referring to FIG. 4, a representative printing apparatus according to the present invention is shown comprising a print head 30 having a plurality of nozzles 32 and control means 34 and 36 electrically coupled with the print head. The control means can be any of those known in the art to be capable of controlling placement of the print head relative the printing substrate and actuating (i.e., ejecting ink 38 from) the print head. Control means amenable to the practice of this invention include computing devices such microprocessors, microcontrollers, capacitors, switches, circuits, logic gates, or equivalent logic devices. Representative control means include a personal computer coupled to a print head driver board. Representative software packages include the Adobe Photoshop and Corel Draw products. Representative ink jet printers include those manufactured by Dataproducts Corporation (Woodland Hills, Calif.), Jarfalla (Sweden), Encad (San Diego, Calif.), AlphaMerics (Simi Valley, Calif.), Videojet (Wood Dale, Ill.), particularly the Epson Stylus (Epson Corporation, Torrance, Calif.), HP 600c, HP 650c, HP 855c, and HP 750c ink jet printers (Hewlett-Packard Corp., Palo Alto, Calif.) and the Raster Image Processor (Alan Graphics, Peekskill, N.Y.).

An ink according to present invention is any liquid or solid moiety that is both substantially opaque to actinic radiation in at least one wavelength region effective to cure the above-described photocurable elements and substantially resistant to polymerization upon exposure to actinic radiation in that wavelength region. Substantially opaque inks are those that can absorb at least about 85% of any incident actinic radiation, preferably about 90% of such radiation, more preferably about 95%, and even more preferably 99.9% of such radiation. It will be recognized that a substantially opaque ink need not be substantially opaque in all amounts and at all possible concentrations, so long as it can be deposited upon a substrate in sufficient quantity so as to be substantially opaque. Inks are substantially resistant to polymerization in accordance with the invention so long as they can be removed from the surface of plates to which they are applied (preferably using conventional plate-washing techniques) without damaging the relief surface, and so long as they do not react with or otherwise alter the chemical and/or physical properties of the plate to such an extent that their removal damages the relief surface. Preferred inks include one or more radiation-absorptive molecules dissolved in solvent, preferably at concentrations of about 3 to about 20 weight percent. Particularly preferred inks are the U-26, Black 4D, and Jolt brands (Dataproducts Corporation) and those formed by mixing Crown Super Marking Stamping Ink (Fulton Marking Equipment Company, Warminster, Pa.) and UVINUL 3050 brand 2,2',4,4,-tetrahydroxybenzophenone (BASF, Ludwigshaven, Germany) in a solvent selected from methanol, isopropanol, n-butanol, chloroform, methyl ethyl ketone, propylene glycol monomethyl ether, dipropylene glycol monomethyl ether, diethylene glycol ethyl ether, and mixtures thereof. Other useful ink ingredients include the Tinopal SPF and Joncryl 68 products, which are commercially available from Ciba-Geigy Corp., Hawthorn, N.Y., and S.C. Johnson Company, Milwaukee, Wis., respectively.

The methods of the invention involve the transfer of a negative image to the surface of photocurable elements without use of phototools or photomasks. This typically is accomplished by removing the cover sheet from mounted, commercially-available photocurable elements and then printing the negative image on the surfaces exposed by removal of the cover sheets.

After the negative image has been transferred, it (and, hence, at least a portion of the composite plate) is exposed to actinic radiation, preferably UV light, in a suitable wavelength region. There are many devices that can be used to perform this so-called "front" exposure of the photocurable elements, including FLEXLIGHT® brand UV modules (Polyfibron Technologies, Inc.), as well as those manufactured by Anderson & Vreeland (Bryan, Ohio). For certain applications, it may be desirable to combine the printing and exposing functions in a single device. It also may be desirable to "back" expose the photocurable elements by exposing the support layers thereof elements to actinic radiation for a time and under conditions effective to cure a portion of the photocurable material in the region adjacent the support. This back exposure can be performed after the mounting step (provided that the carrier sheet and the mounting means are sufficiently transparent to actinic radiation), but more preferably is performed before the photocurable elements have been mounted.

Following front exposure of the negative image to actinic radiation, uncured photopolymer is removed from the mounted photocurable elements, typically by washing the elements with (and/or in) an organic and/or aqueous solvent in which the photocurable material is at least somewhat soluble. This solvent wash step typically is accompanied or preceded by brushing, wiping, or some other mild, non-destructive abrasion of the elements. Useful washing devices include those commercially available from Polyfibron Technologies and Anderson & Vreeland.

Additional objects, advantages, and novel features of this invention will become apparent to those skilled in the art upon examination of the following examples thereof, which are not intended to be limiting.

EXAMPLE 1

A 36"×38" polyethylene terephthalate carrier sheet having thickness of 7 mils was cut from a roll and was placed in an AlphaMerics brand ink jet plotter. Dimensional outlines of photocurable elements to be mounted on the carrier sheet were generated from a computer-stored electronic image using Photoshop brand software. The outlines were drawn on the carrier sheet in approximate register using the plotter and conventional inks.

EPIC® brand 067 photocurable elements of the respective dimensions were cut and back exposed for 16 seconds on a FLEXLIGHT® brand model 5280 exposure unit (Polyfibron Technologies, Inc.). These elements then were mounted on the carrier sheet on the respective dimensional outlines. Mounting of the elements on the carrier sheet was accomplished using a double-sided adhesive tape.

Coversheets were removed from the mounted elements and the composite plate was placed in the plotter. A stored negative image was sent to the plotter from the a computer and was printed onto the plate at 600 DPI using Jolt brand ink. The thickness of the ink laid down (approximately 1 mil) from a 50 $\mu$m office head was sufficient to block 99.9% of the UV light used during subsequent curing. The software allowed printing of the negative image only in those areas which had the mounted elements. Very accurate registration was accomplished by the computer driving the ink-jet plotter.

The carrier bearing the mounted, imaged elements then was UV flood exposed in the FLEXLIGHT® brand exposure unit for 15 minutes. The composite plate then was processed by applying a continuous supply of SOLVIT™ brand solvent (Polyfibron Technologies, Inc.) while brushing uncured polymer from the plate in a FLEXLIGHT® brand Processor 5280, Serial No. 017 in-line processor for six minutes. The double-sided adhesive tape resisted the solvent during the processing. The carrier was dried and post-exposed in a FLEXLIGHT® brand Dryer 5280, Serial No. 017 dryer and finishing unit.

Carriers bearing negatively imaged elements then are mounted on a 36" circumference drum, the elements already being in register. Conventional printing ink is applied to the negative relief surface, and the surface is contracted with a sheet of paper to produce a high quality positive image.

Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

What is claimed is:

1. A method for preparing a composite printing plate, comprising the steps of:
    transferring registration information by ejecting ink from an ink jet print head to a first face of a substantially planer carrier sheet having first and second opposing major faces of defined surface area;
    disposing a first face of at least one substantially planer photocurable element having first and second opposing major faces of defined surface area upon the first face of said carrier sheet possessing said registration information;
    ejecting a negative-forming ink from said ink jet print head onto the second face of said photocurable element, said negative-forming ink being substantially opaque to actinic radiation in at least one wavelength region effective to cure photocurable material within said element and substantially resistant to polymerization upon exposure to actinic radiation in said wavelength region.

2. The method of claim 1 wherein said second face of said photocurable element is a layer of photocurable material.

3. The method of claim 1 wherein said second face of said photocurable element is a transparent protective layer disposed upon a layer of photocurable material.

4. The method of claim 1 wherein said photocurable material is disposed upon a support layer.

5. The method of claim 1 wherein said photocurable material comprises an elastomer compound, an ethylenically unsaturated compound having at least one terminal ethylenic group, and a photoinitiator.

6. The method of claim 1 wherein said element is disposed upon said carrier sheet through use of an adhesive.

7. The method of claim 1 wherein said actinic radiation is ultraviolet light.

8. The method of claim 1 wherein said wavelength region is from about 300 to about 400 nm.

9. The method of claim 1 wherein at least one of said inks is ejected from said print head by actuating control means electrically coupled with said print head.

10. The method of claim 1 wherein said photocurable element is disposed upon said first face of said carrier sheet in accordance with said registration information.

11. The method of claim 1 wherein said registration information comprises an image corresponding to an outline of at least one photocurable element.

12. The method of claim 11 wherein said registration information comprises a rectilinear image having a shape corresponding to said outline.

13. The method of claim 11 wherein said registration information comprises an elliptical image having a shape corresponding to said outline.

14. The method of claim 1 wherein said registration information comprises an image corresponding to a portion of an outline of at least one photocurable element.

15. The method of claim 14 wherein said registration information comprises perpendicular lines having a shape corresponding a portion of said outline.

16. The method of claim 14 wherein said registration information comprises an arc having a shape corresponding to a portion of said outline.

17. The method of claim 1 further comprising exposing said first face of said photocurable element to actinic radiation for a time and under conditions effective to cure said photocurable material.

18. The method of claim 1 further comprising exposing said second face of said photocurable element to actinic radiation in said wavelength region for a time and under conditions effective to cure exposed areas of said photocurable material.

19. The method of claim 18 further comprising removing uncured photocurable material from said photocurable element after exposure.

20. The method of claim 1 wherein said photocurable element comprises a plurality of photocurable layers.

* * * * *